United States Patent
Kamiya

(10) Patent No.: US 6,344,957 B1
(45) Date of Patent: Feb. 5, 2002

(54) OVERSHOOT/UNDERSHOOT PREVENTION DEVICE AND OVERSHOOT/UNDERSHOOT PREVENTION METHOD

(75) Inventor: Hiroshi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/420,834

(22) Filed: Oct. 19, 1999

(30) Foreign Application Priority Data

Oct. 28, 1998 (JP) .......................................... 10-321352

(51) Int. Cl.[7] ................................................ H02H 3/00
(52) U.S. Cl. ............................ 361/90; 361/92; 361/115
(58) Field of Search ............................ 361/90, 92, 115, 361/100, 101, 86, 87, 79, 91.1

(56) References Cited

U.S. PATENT DOCUMENTS

| | | | | |
|---|---|---|---|---|
| 5,514,976 A | * | 5/1996 | Ohmura | ...................... 324/765 |
| 6,014,303 A | * | 1/2000 | Kamiya | ...................... 361/101 |
| 6,215,347 B1 | * | 4/2001 | Kamiya | ...................... 327/379 |

FOREIGN PATENT DOCUMENTS

| | | | | |
|---|---|---|---|---|
| JP | H1-195720 | 8/1989 | .......... | H03K/19/00 |
| JP | H3-195126 | 8/1991 | ......... | H03K/19/094 |
| JP | 5-291931 | 11/1993 | ....... | H03K/19/0175 |
| JP | 6-5092 | 1/1994 | .......... | G11C/27/02 |
| JP | 6-237164 | 8/1994 | ....... | H03K/19/0948 |
| JP | 8-162941 | 6/1996 | ....... | H03K/19/0175 |
| JP | 10-504434 | 4/1998 | .......... | H03K/17/16 |

\* cited by examiner

*Primary Examiner*—Stephen W. Jackson
(74) *Attorney, Agent, or Firm*—Sughrue Mion, PLLC

(57) ABSTRACT

The present invention has the object of providing an overshoot/undershoot prevention device and overshoot/undershoot prevention method that are highly effective against both overshoot and undershoot. The overshoot/undershoot prevention device is provided with an overshoot shaping device that selects the portion of a waveform signal that equals or exceeds an overshoot determining potential when the potential of the waveform signal equals or exceeds the overshoot determining potential, outputs the selected portion as an overshoot waveform, attenuates the overshoot component of the waveform signal, and outputs the result as a shaped waveform in accordance with the time that the overshoot waveform continues. Also included is an undershoot shaping device that selects the portion of the waveform signal that equals or falls below an undershoot determining potential when the potential of the waveform signal equals or falls below the undershoot determining potential, outputs the sleeted portion as an undershoot waveform, attenuates the undershoot component of the waveform signal, and outputs the result as a shaped waveform in accordance with the time that the undershoot waveform continues.

11 Claims, 1 Drawing Sheet

OVERSHOOT/UNDERSHOOT PREVENTION DEVICE AND OVERSHOOT/UNDERSHOOT PREVENTION METHOD

BACKGROUND OF THE INVENTION

1. Field of the Invention

The present invention relates to an overshoot/undershoot prevention device and overshoot/undershoot prevention method for outputting a received waveform signal as a regulated waveform with attenuated overshoot and undershoot.

2. Description of the Related Art

Japanese Patent Laid-open No. 291931/93 discloses one example of this type of device in the prior art. The invention disclosed in the above official gazette is directed to solving a problem that a high level of overshoot, undershoot, or ringing occurs in an open-drain output circuit of the prior art. This problem arises when the input voltage changes from High level to Low level, whereupon the resistance across the source and drain of the output transistor is low and considerable time is required until the discharged energy attenuates. According to the construction of this invention, the device is provided with:

a package having a reference region in at least one portion;

an output terminal provided in the package that is connected to an outside power source by way of a load resistance;

a common terminal provided in the package that is connected to an external reference potential point and that generates a load capacitance between the load resistance;

a field effect transistor provided on the package having its drain region connected to the output terminal and its source region connected to a common terminal and in which conductivity between the drain region and source region changes in accordance with the value of a control voltage applied between the gate region and source region; and a control voltage generating means that, when changing the control voltage from a high level to a low level when the input voltage makes a stepped change from a high level to a low level, effects a two-stage change from a high rate of change per unit time to a low rate of change per unit time.

In the device disclosed in Japanese Patent Laid-open No. 291931/93 configured as described above, when the control voltage generated by the control voltage generating means changes from High level to Low level, the rate of change per unit time changes from a high rate to a low rate, and the resistance across the drain region and source region of the field effect transistor therefore quickly rises to a particular value and then increases gradually. The resistance across the drain region and source region of the field effect transistor is therefore held at an intermediate value between the ON resistance and OFF resistance longer than in a device of the prior art, and the attenuation of the discharge energy is thus effected more rapidly.

Although the above-described prior art regulates attenuation by controlling resistance value, no particular consideration is given to the characteristics when actually connected to a transmission line. When actually connected to a transmission line, the problem typically occurs that a circuit having superior overshoot suppressing characteristics exhibits weak undershoot suppressing characteristics, and a circuit having superior undershoot suppressing characteristics exhibits weak overshoot suppressing characteristics.

SUMMARY OF THE INVENTION

The present invention was achieved in view of the above-described problems and has the object of providing an overshoot/undershoot prevention device and overshoot/undershoot prevention method that feature both good overshoot and undershoot characteristics when connected to a transmission line.

The overshoot/undershoot prevention device of the present invention attenuates overshoot and undershoot from a waveform signal that is applied to a waveform input section and outputs the result as a shaped waveform, the device includes an overshoot shaping device that attenuates overshoot from the waveform signal and outputs the result as a shaped waveform, and an undershoot shaping device that attenuates undershoot from the waveform signal and outputs the result as the shaped waveform;

wherein the overshoot shaping device selects the portion of the waveform signal that equals or exceeds an overshoot determining potential when the potential of the waveform signal equals or exceeds the overshoot determining potential and outputs the selected portion as an overshoot waveform, attenuates the overshoot component of that waveform signal according to the time the overshoot waveform continues, and outputs the result as the shaped waveform; and the undershoot shaping device selects the portion of the waveform signal that equals or falls below an undershoot determining potential when the potential of the waveform signal equals or falls below the undershoot determining potential and outputs the selected portion as an undershoot waveform, attenuates the undershoot component of that waveform signal according to the time that the undershoot waveform continues, and outputs the result as the shaped waveform.

In this case, the overshoot shaping device may be provided with:

an overshoot determining means that compares the overshoot determining potential received from an overshoot determining potential input section with the potential of the waveform signal applied to the waveform input section, selects the portion of the waveform signal that equals or exceeds the overshoot determining potential when the potential of the waveform signal equals or exceeds the overshoot determining potential and outputs the selected portion as an overshoot waveform;

an overshoot time detecting means that takes in the overshoot waveform to find the time that the overshoot waveform continues and outputs an overshoot time signal; and an overshoot attenuation outputting means that, in addition to taking in the waveform signal and the overshoot time signal, attenuates the overshoot component of the waveform signal according to the time the overshoot waveform continues based on the overshoot time signal and outputs the result as the shaped waveform.

Further, the undershoot shaping device may be provided with:

an undershoot determining means that compares the undershoot determining potential received from an undershoot determining potential input section with the potential of the waveform signal applied to the waveform input section, selects the portion of the waveform signal that equals or falls below the undershoot determining potential when the potential of the waveform signal equals or falls below the undershoot determining potential, and outputs the selected portion as an undershoot waveform;

an undershoot time detecting means that takes in the undershoot waveform to find the time that the undershoot waveform continues, and outputs an undershoot time signal; and an undershoot attenuation outputting means that, in addition to taking in the waveform signal and the undershoot time signal, attenuates the undershoot component of the waveform signal according to the time that the undershoot waveform continues based on the undershoot time signal, and outputs the result as the shaped waveform.

In addition, the overshoot determining means may also include: a first differential circuit that compares the overshoot determining potential received from the overshoot determining potential input section with the potential of the waveform signal applied to the waveform signal input section, selects the portion of the waveform signal that equals or exceeds the overshoot determining potential when the potential of the waveform signal equals or exceeds the overshoot determining potential, and outputs the selected portion as the overshoot waveform.

The overshoot time detecting means may include a differentiating circuit that is provided with a first capacitance member and a second resistance member and that differentiates the overshoot waveform and outputs the obtained differentiated waveform as the overshoot time signal.

The overshoot attenuation outputting means may include:

a first resistance member that is connected to the overshoot attenuating potential; and an NMOS transistor that, in addition to taking in the waveform signal and the overshoot time signal, is activated in accordance with the time that the overshoot waveform continues based on the overshoot time signal, attenuates the overshoot component of the waveform signal via the first resistance member, and outputs the result as the shaped waveform.

The undershoot determining means may include a second differential circuit that compares the undershoot determining potential received from the undershoot determining potential input section with the potential of the waveform signal that is applied to the waveform input section, selects the portion of the waveform signal that equals or falls below the undershoot determining potential when the potential of the waveform signals equals or falls below the undershoot determining potential, and outputs the selected portion as the undershoot waveform.

The undershoot time detecting means may include a differentiating circuit that is provided with a second capacitance member and a fourth resistance member, and that differentiates the undershoot waveform and outputs the obtained differentiated waveform as the undershoot time signal.

The undershoot attenuation output means may include:

a third resistance member that is connected to the undershoot attenuating potential; and a PMOS transistor that, in addition to taking in the waveform signal and the undershoot time signals, is activated in accordance with the time that the undershoot waveform continues based on the undershoot time signals, attenuates the undershoot component of the waveform signal via the third resistance member, and outputs the result as the shaped waveform.

The overshoot/undershoot prevention method of the present invention attenuates overshoot and undershoot from a waveform signal that is applied to a waveform input section and outputs the result as a shaped waveform, the method includes:

an overshoot shaping process in which overshoot is attenuated from the waveform signal and the result outputted as a shaped waveform, and an undershoot shaping process in which undershoot is attenuated from the waveform signal and the result outputted as the shaped waveform;

wherein the overshoot shaping process is a process in which the portion of the waveform signal that equals or exceeds an overshoot determining potential is selected when the potential of the waveform signal equals or exceeds the overshoot determining potential and is outputted as an overshoot waveform, and the overshoot component of the waveform signal is attenuated and outputted as the shaped waveform in accordance with the time that the overshoot waveform continues; and the undershoot shaping process is a process in which the portion of the waveform signal that equals or falls below an undershoot determining potential is selected and outputted as an undershoot waveform when the potential of the waveform signal equals or falls below the undershoot determining potential, and the undershoot component of the waveform signal is attenuated and outputted as the shaped waveform in accordance with the time that the undershoot waveform continues.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1:
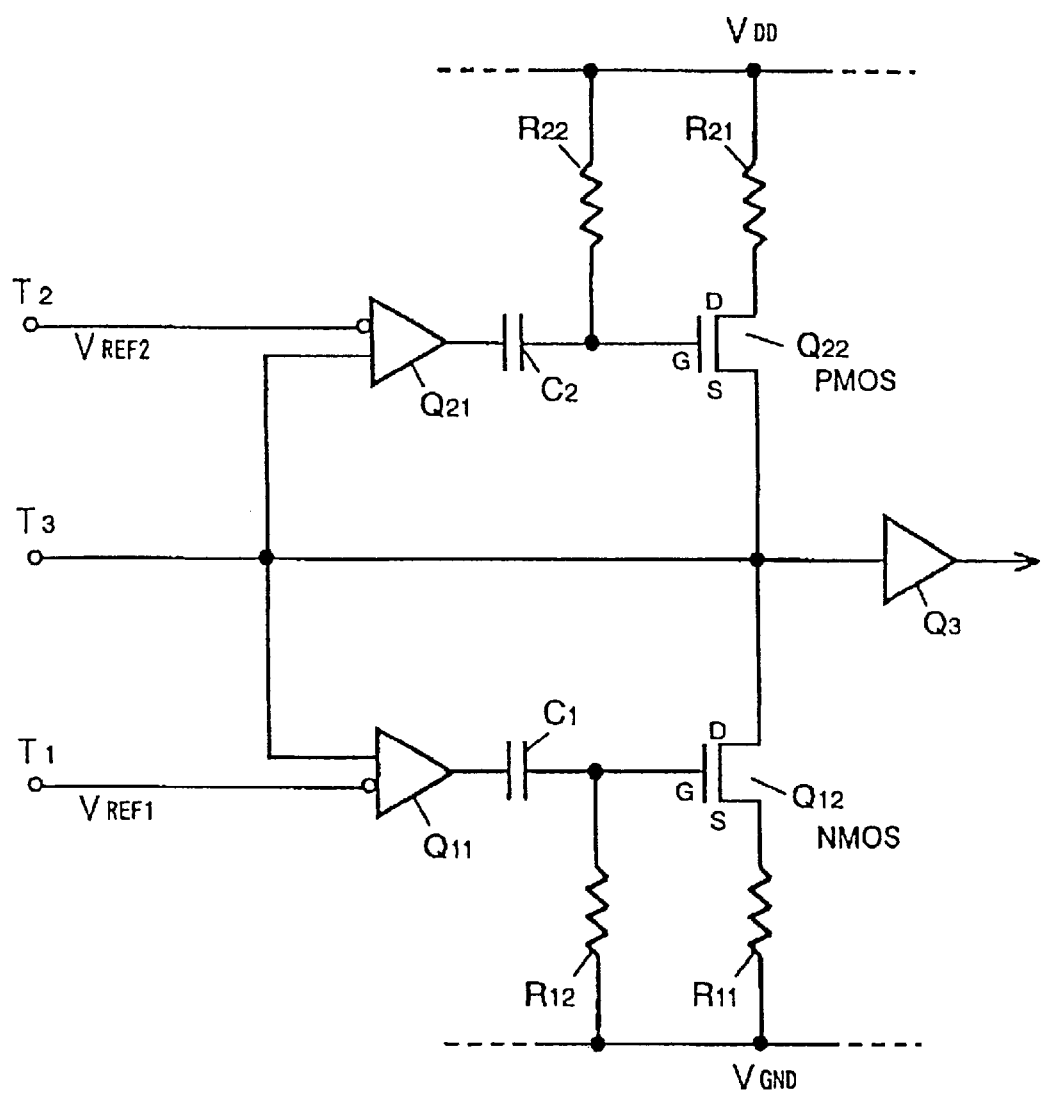
FIG. 1 is a circuit diagram showing one embodiment of the overshoot/undershoot prevention device of the present invention and a semiconductor device that uses the device of the present invention.

An embodiment of the present invention is next described in detail with reference to FIG. 1. FIG. 1 is a circuit diagram showing the construction of one embodiment of a semiconductor device as an overshoot/undershoot prevention device according to the present invention.

The semiconductor device of this embodiment is equipped with output buffer Q3 and has the function of attenuating overshoot and undershoot from a waveform signal applied to waveform input section T3 and outputting the result as a shaped waveform from output buffer Q3.

In this embodiment, overshoot and undershoot are attenuated and the result is outputted as a shaped waveform by carrying out: an overshoot shaping process in which overshoot is attenuated for a waveform signal received in waveform input section T3 and the result is outputted as a shaped waveform; and an undershoot shaping process in which undershoot is attenuated from the waveform signal and the result is outputted as a shaped waveform.

The shaping process that attenuates overshoot is carried out when the potential of the waveform signal equals or exceeds overshoot determining potential $V_{REF1}$. In this process, the portion of the waveform signal that equals or exceeds overshoot determining potential $V_{REF1}$ is selected as the overshoot waveform and outputted, and the overshoot component of the waveform signal is attenuated and outputted as a shaped wave according to the time that the overshoot waveform continues. The shaping process that attenuates undershoot is carried out when the potential of the waveform signal equals or falls below undershoot determining potential $V_{REF2}$. In this process, the portion of the waveform signal that equals or falls below undershoot determining potential $V_{REF2}$ is selected as the undershoot waveform and outputted, and the undershoot component of the waveform signal is attenuated and outputted as a shaped wave according to the time that the undershoot waveform continues.

Explanation is next presented regarding the circuit configuration of this embodiment based on FIG. 1. Overshoot determining potential $V_{REF1}$ is connected to overshoot determining potential input section T1, which is one input section of first differential circuit Q11, and undershoot determining potential $V_{REF2}$ is connected to undershoot determining potential input section T2, which is one input section of second differential circuit Q21. The other input sections of first differential circuit Q11 and second differential circuit Q21 are connected to waveform input section T3, the drain of NMOS transistor Q12, the source of PMOS transistor Q22, and the input section of output buffer Q3.

The output section of first differential circuit Q11 is connected to the gate of NMOS transistor Q12 by way of first capacitance member C1. The source of NMOS transistor Q12 is connected to the overshoot attenuating potential $V_{GND}$ by way of first resistance member R11, and the gate of NMOS transistor Q12 is connected to overshoot attenuating potential $V_{GND}$ by way of second resistance member R12.

The output section of second differential circuit Q21 is connected to the gate section of PMOS transistor Q22 by way of second capacitance member C2. The drain section and gate section of PMOS transistor Q22 are both connected to undershoot attenuating potential $V_{DD}$, the drain section by way of third resistance member R21 and the gate section by way of fourth resistance member R22. Explanation next regards the overshoot/undershoot prevention functions in this embodiment beginning with a description of the portion that shapes the overshoot waveform.

The overshoot shaping device that shapes overshoot in this embodiment is made up by first differential circuit Q11, first resistance member R11, second resistance member R12, first capacitance member C1, and NMOS transistor Q12.

The overshoot shaping device has the functions of selecting the portion of the waveform signal that equals or exceeds overshoot determining potential $V_{REF1}$ when the potential of the waveform signal equals or exceeds overshoot determining potential $V_{REF1}$ and outputting the selected portion as the overshoot waveform, attenuating the overshoot component of the waveform signal, and outputting the result as a shaped waveform according to the time that the overshoot waveform continues. The overshoot shaping device is made up by an overshoot determining means, an overshoot time detecting means, and an overshoot attenuation outputting means. In concrete terms, the overshoot determining means is constituted by first differential circuit Q11. First differential circuit Q11 compares overshoot determining potential $V_{REF1}$ received from overshoot determining potential input section T1 with the potential of the waveform signal applied to waveform input section T3, and when the potential of the waveform signal equals or exceeds overshoot determining potential $V_{REF1}$, selects the portion of the waveform signal that equals or exceeds overshoot determining potential $V_{REF1}$ and outputs the selected portion as the overshoot waveform. The overshoot time detecting means has the functions of taking in the overshoot waveform to find the time that overshoot waveform continues and outputting an overshoot time signal. The overshoot time detecting means is constituted by a differentiating circuit made up by first capacitance member C1 and second resistance member R12. The differentiating circuit converts the overshoot waveform applied to one end of first capacitance member C1 to a differentiated waveform and outputs the result as the overshoot time signal to the gate section of NMOS transistor Q12.

The overshoot attenuation outputting means has the functions of taking in the waveform signal and overshoot time signal, and further, and attenuating the overshoot component of the waveform signal according to the time that the overshoot waveform continues, based on the overshoot time signal. The overshoot attenuation outputting means is made up from first resistance member R11 and NMOS transistor Q12.

One terminal of first resistance member R11 is connected to overshoot attenuating potential $V_{GND}$ (ground potential). NMOS transistor Q12, which has the waveform signal supplied to its drain section and the overshoot time signal applied to its gate section, is activated and enters a conductive (ON) state in accordance with the time that the overshoot waveform continues based on the overshoot time signal, attenuates the overshoot component of the waveform signal by bypassing the overshoot component of the waveform signal to overshoot attenuating potential $V_{GND}$ by way of first resistance member R11 that is connected to the source section, and outputs the result as a shaped waveform.

Explanation next regards the portion that shapes the undershoot waveform.

The undershoot shaping device that shapes undershoot in this embodiment is made up by second differential circuit Q21, third resistance member R21, fourth resistance member R22, second capacitance member C2, and PMOS transistor Q22.

The undershoot shaping device has the functions of selecting the portion of the waveform signal that equals or falls below undershoot determining potential $V_{REF2}$ when the potential of the waveform signal equals or falls below undershoot determining potential $V_{REF2}$, outputting the selected portion as the undershoot waveform, attenuating the undershoot component of the waveform signal, and outputting the result as a shaped waveform according to the time that the undershoot waveform continues. The undershoot shaping device is made up by an undershoot determining means, an undershoot time detecting means, and an undershoot attenuation outputting means.

In concrete terms, the undershoot determining means is constituted by second differential circuit Q21. Second differential circuit Q21 compares undershoot determining potential $V_{REF2}$ received from undershoot determining potential input section T2 with the potential of the waveform signal applied to waveform input section T3, and when the potential of the waveform signal equals or falls below undershoot determining potential $V_{REF2}$, selects the portion of the waveform signal that equals or falls below undershoot determining potential $V_{REF2}$ and outputs the selected portion as the undershoot waveform.

The undershoot time detecting means has the functions of taking in the undershoot waveform to find the time that the undershoot waveform continues, and outputting an undershoot time signal. The undershoot time detecting means is constituted by a differentiating circuit made up by second capacitance member C2 and fourth resistance member R22. The differentiating circuit converts the undershoot waveform applied to one terminal of second capacitance member C2 to a differentiated waveform and outputs the result as the undershoot time signal to the gate section of PMOS transistor Q22.

The undershoot attenuation outputting means has the functions of taking in the waveform signal and the undershoot time signal, and further, attenuating the undershoot component of the waveform signal according to the time that the undershoot waveform continues, which is based on the undershoot time signal, and outputting the result as a shaped waveform. The undershoot attenuation outputting means is made up by third resistance member R21 and PMOS transistor Q22.

One terminal of third resistance member R21 is connected to undershoot attenuating potential $V_{DD}$. PMOS transistor Q22, which has the waveform signal supplied to its source section and the undershoot time signal applied to its gate section, is activated and enters a conductive (ON) state in accordance with the time that the undershoot waveform continues based on the undershoot time signal, attenuates the undershoot component of the waveform signal by bypassing the undershoot component of the waveform signal to undershoot attenuating potential $V_{DD}$ by way of third resistance member R21, and outputs the result as a shaped waveform. Explanation next regards the principal of this embodiment.

The gate section of PMOS transistor Q22 is connected to undershoot attenuating potential $V_{DD}$ by way of fourth resistance member R22, and PMOS transistor Q22 is OFF (in an inactive state) when a waveform is not being applied to waveform input section T3.

The gate section of NMOS transistor Q12 is connected to overshoot attenuating potential $V_{GND}$ by way of second resistance member R12, and NMOS transistor Q12 is OFF (in an inactive state) when a waveform is not being applied to waveform input section T3.

When a rising waveform that exceeds overshoot determining potential $V_{REF1}$ is applied to waveform input section T3, a rising waveform is outputted from the output section of first differential circuit Q11. This rising output waveform passes through a differentiating circuit made up by first capacitance member C1 and second resistance member R12 where it becomes a differentiated waveform with a peaked form (bulging up), and is then applied to the gate section of NMOS transistor Q12.

Waveform input section T3 and overshoot attenuating potential $V_{GND}$ are connected by way of first resistance member R11 only while NMOS transistor Q12 is turned ON (activated) by the above-described differentiated waveform. The rising waveform of waveform input section T3 is terminated at overshoot attenuating potential $V_{GND}$ by this first resistance member R11, and overshoot can therefore be prevented.

Next, when a falling waveform is applied to waveform input section T3, a falling waveform is outputted at the output section of second differential circuit Q21 when the potential of the falling waveform falls below undershoot determining potential $V_{REF2}$ at second differential circuit Q21. This falling output waveform passes through a differentiating circuit made up by second capacitance member C2 and fourth resistance member R22 where it becomes a differentiated waveform having a sagging form (curving downward) and is then applied to the gate section of PMOS transistor Q22. Waveform input section T3 and undershoot attenuating potential $V_{DD}$ are connected by way of third resistance member R21 only while PMOS transistor Q22 is turned ON (in an active state) by the above-described differentiated waveform. The falling waveform of waveform input section T3 is terminated at undershoot attenuating potential $V_{DD}$ by this third resistance member R21, and undershoot can therefore be prevented. Although NMOS and PMOS transistors are used in this embodiment, the invention is not limited to this construction and may also be constituted by bipolar transistors. In addition, the invention is not limited by such factors as the number, position, and form of the above-described constituent elements in the above-described embodiment, and in working the present invention, any suitable number, position, and form of constituent elements may be applied as appropriate. The present invention has the effect of realizing an overshoot/undershoot prevention device as well as a semiconductor device and an overshoot/undershoot prevention method that are effective against both overshoot and undershoot when connected to a transmission line by: selecting the portion of a waveform signal that equals or exceeds an overshoot determining potential when the potential of the waveform signal equals or exceeds the overshoot determining potential, attenuating the overshoot component of the waveform signal in accordance with the time that the overshoot waveform continues and outputting the result as a shaped waveform; and selecting the portion of the waveform signal that equals or falls below an undershoot determining potential when the potential of the waveform signal equals or falls below the undershoot determining potential, attenuating the undershoot component of the waveform signal in accordance with the time that the undershoot waveform continues, and outputting the result as a shaped waveform.

While preferred embodiments of the present invention have been described using specific terms, such description is for illustrative purposes only, and it is to be understood that changes and variations may be made without departing from the spirit or scope of the following claims.

What is claimed is:

1. An overshoot/undershoot prevention device for attenuating overshoot and undershoot from a waveform signal that is applied to a waveform input section and outputting the result as a shaped waveform, said overshoot/undershoot prevention device comprising:

an overshoot shaping device for attenuating overshoot from said waveform signal and outputting the result as said shaped waveform; and an undershoot shaping device for attenuating undershoot from said waveform signal and outputting the result as said shaped waveform, wherein said overshoot shaping device selects the portion of said waveform signal that equals or exceeds an overshoot determining potential when the potential of said waveform signal equals or exceeds said overshoot determining potential and outputs the selected portion as an overshoot waveform, attenuates the overshoot component of said waveform signal according to the time that said overshoot waveform continues, and outputs the result as said shaped waveform, and said undershoot shaping device selects the portion of said waveform signal that equals or falls below an undershoot determining potential when the potential of said waveform signal equals or falls below said undershoot determining potential and outputs the selected portion as an undershoot waveform, attenuates the undershoot component of said waveform signal according to the time that said undershoot waveform continues, and outputs the result as said shaped waveform.

2. An overshoot/undershoot prevention device according to claim 1, wherein said overshoot shaping device comprises:

an overshoot determining means for comparing said overshoot determining potential received from an overshoot determining potential input section with the potential of the waveform signal applied to said waveform input section, selecting the portion of the waveform signal that equals or exceeds said overshoot determining potential when the potential of said waveform signal equals or exceeds said overshoot determining potential and outputting the selected portion as an overshoot waveform;

an overshoot time detecting means for taking in said overshoot waveform to find the time that the overshoot waveform continues, and outputting an overshoot time signal; and an overshoot attenuation outputting means for, in addition to taking in said waveform signal and said overshoot time signal, attenuating the overshoot component of said waveform signal according to the time that the overshoot waveform continues based on said overshoot time signal and outputting the result as said shaped waveform.

3. An overshoot/undershoot prevention device according to claim 1, wherein said undershoot shaping device comprises:

an undershoot determining means for comparing said undershoot determining potential received from an undershoot determining potential input section with the potential of the waveform signal applied to said waveform input section, selecting the portion of said waveform signal that equals or falls below said undershoot determining potential when the potential of said waveform signal equals or falls below said undershoot determining potential, and outputting the selected portion as an undershoot waveform;

an undershoot time detecting means for taking in said undershoot waveform to find the time that said undershoot waveform continues, and outputting an undershoot time signal; and an undershoot attenuation outputting means for, in addition to taking in said waveform signal and said undershoot time signal, attenuating the undershoot component of said waveform signal according to the time that the undershoot waveform continues based on said undershoot time signal and outputting the result as said shaped waveform.

4. An overshoot/undershoot prevention device according to claim 2, wherein said undershoot shaping device comprises:

an undershoot determining means for comparing said undershoot determining potential received from an undershoot determining potential input section with the potential of the waveform signal applied to said waveform input section, selecting the portion of said waveform signal that equals or falls below said undershoot determining potential when the potential of said waveform signal equals or falls below said undershoot determining potential, and outputting the selected portion as an undershoot waveform;

an undershoot time detecting means for taking in said undershoot waveform to find the time that said undershoot waveform continues, and outputting an undershoot time signal; and an undershoot attenuation outputting means for, in addition to taking in said waveform signal and said undershoot time signal, attenuating the undershoot component of said waveform signal according to the time that the undershoot waveform continues based on said undershoot time signal and outputting the result as said shaped waveform.

5. An overshoot/undershoot prevention device according to claim 2, wherein said overshoot determining means includes:

a first differential circuit for comparing said overshoot determining potential received from said overshoot determining potential input section with the potential of the waveform signal that is applied to said waveform input section, selecting the portion of said waveform signal that equals or exceeds said overshoot determining potential when the potential of said waveform signal equals or exceeds said overshoot determining potential, and outputting the selected portion as an overshoot waveform.

6. An overshoot/undershoot prevention device according to claim 2, wherein said overshoot time detecting means includes:

a differentiating circuit that is provided with a first capacitance member and a second resistance member, and differentiates said overshoot waveform and outputs the obtained differentiated waveform as said overshoot time signal.

7. An overshoot/undershoot prevention device according to claim 2, wherein said overshoot attenuation outputting means includes:

a first resistance member that is connected to the overshoot attenuating potential; and a NMOS transistor that, in addition to taking in said waveform signal and said overshoot time signal, is activated in accordance with the time that the overshoot waveform continues based on said overshoot time signal, attenuates the overshoot component of said waveform signal via said first resistance member, and outputs the result as said shaped waveform.

8. An overshoot/undershoot prevention device according to claim 3, wherein said undershoot determining means includes:

a second differential circuit for comparing said undershoot determining potential received from said undershoot determining potential input section with the potential of the waveform signal that is applied to said waveform input section, selecting the portion of said waveform signal that equals or falls below said undershoot determining potential when the potential of said waveform signal equals or falls below said undershoot determining potential, and outputting the selected portion as said undershoot waveform.

9. An overshoot/undershoot prevention device according to claim 3, wherein said undershoot time detecting means includes:

a differentiating circuit that is provided with a second capacitance member and a fourth resistance member, and differentiates said undershoot waveform and outputs the obtained differentiated waveform as said undershoot time signal.

10. An overshoot/undershoot prevention device according to claim 3, wherein said undershoot attenuation outputting means includes:

a third resistance member that is connected to an undershoot attenuating potential; and a PMOS transistor that, in addition to taking in said waveform signal and said undershoot time signals, is activated in accordance with the time that the undershoot waveform continues based on said undershoot time signal, attenuates the undershoot component of said waveform signal via said third resistance member, and outputs the result as said shaped waveform.

11. An overshoot/undershoot prevention method for attenuating overshoot and undershoot from a waveform signal that is applied to a waveform input section and outputting the result as a shaped waveform, said overshoot/undershoot prevention method comprising:

an overshoot shaping process for attenuating overshoot from said waveform signal and outputting the result as said shaped waveform; and an undershoot shaping process for attenuating undershoot from said waveform signal and outputting the result as said shaped waveform, wherein said overshoot shaping process is a process in which the portion of said waveform signal that equals or exceeds an overshoot determining potential is selected when the potential of said waveform signal equals or exceeds said overshoot determining potential and is outputted as an overshoot waveform, and the overshoot component of said waveform signal is attenuated and outputted as said shaped waveform in accordance with the time that said overshoot waveform continues, and said undershoot shaping process is a process in which the portion of said waveform signal that equals or falls below an undershoot determining potential is selected and outputted as an undershoot waveform when the potential of said waveform signal equals or falls below said undershoot determining potential, and the undershoot component of said waveform signal is attenuated and outputted as said shaped waveform in accordance with the time that said undershoot waveform continues.

* * * * *